(12) United States Patent
Yoshikawa

(10) Patent No.: US 6,646,836 B2
(45) Date of Patent: Nov. 11, 2003

(54) SUPERCONDUCTING MAGNET APPARATUS IN PERSISTENT MODE

(75) Inventor: Masatoshi Yoshikawa, Kobe (JP)

(73) Assignee: Kabushiki Kaisha Kobe Seiko Sho, Hyogo (JP)

(*) Notice: Subject to any disclaimer, the term of this patent is extended or adjusted under 35 U.S.C. 154(b) by 320 days.

(21) Appl. No.: 09/795,089

(22) Filed: Mar. 1, 2001

(65) Prior Publication Data

US 2002/0171520 A1 Nov. 21, 2002

(51) Int. Cl.⁷ .......................... H02H 7/00; H01H 47/00
(52) U.S. Cl. .................................. 361/19; 361/141
(58) Field of Search ..................... 361/19, 141, 149, 361/86, 91, 56; 335/216

(56) References Cited

U.S. PATENT DOCUMENTS

| | | | |
|---|---|---|---|
| 4,535,291 A | * | 8/1985 | Lee et al. .................... 324/320 |
| 4,763,221 A | * | 8/1988 | Takechi ....................... 361/141 |
| 4,868,707 A | * | 9/1989 | Takechi ....................... 361/141 |
| 5,216,568 A | * | 6/1993 | Harada et al. ................. 361/19 |

FOREIGN PATENT DOCUMENTS

JP  04-061103  6/1990

* cited by examiner

Primary Examiner—Rajnikant B. Patel

(57) ABSTRACT

A superconducting magnet circuit includes, besides a closed circuit formed of a plurality of unit superconducting coils $2a$ and $2b$ connected in series and a first persistent-current switch 4, a second persistent-current switch 5 which forms a closed circuit by connecting the ends of an arbitrary unit superconducting coil $2a$, and is therefore made up of the two closed circuits, whereby their mutual induction suppresses the decay of the magnet apparatus' central magnetic field to provide extreme stability.

11 Claims, 7 Drawing Sheets

SUPERCONDUCTING MAGNET APPARATUS IN PERSISTENT MODE

BACKGROUND OF THE INVENTION

1. Field of the Invention

The present invention relates to a persistent-mode superconducting magnet apparatus in a persistent-current operation, which is incorporated, for example, in a physical and chemical NMR (nuclear magnetic resonance) analyzer or a medical magnetic resonance imaging device (MRI).

2. Description of the Related Art

In general, such a physical and chemical NMR analyzer requires a persistent-mode superconducting magnet apparatus having a high strength of magnetic field and an extremely low temporal change (decay) of magnetic field. Hence, the persistent-mode superconducting magnet apparatus generally uses a closed circuit formed by using a persistent-current switch for a persistent-current operation.

Indeed, however, during a persistent-current operation, mainly due to the minute joint resistance at joints of the superconducting wires between the superconducting coils, a persistent current gradually decays over time to produce a magnetic field decay. A normal soldering at the joints of the superconducting wires makes it difficult to decrease the joint resistance to about $10^{-9}$ ohm or lower since soldering materials are not superconducting materials; however, a joint technique has been developed in which less connectable filaments of the superconducting wires are directly connected by spot welding, pressure, or the like to maintain it at about $10^{-12}$ ohm. This can realize a persistent-mode superconducting magnet apparatus having a magnetic field decay rate of approximately 0.01 ppm/hr.

However, such a joint resistance value between superconducting wires is affected by a magnetic field. Once the magnetic flux density of that joint reaches about 1 T (tesla= $10^4$ gausses) or more, the joint is transitioned from a superconducting state to a normal metallic conducting state, and the joint resistance value is sharply increased to provide a higher electric current (magnetic field) decay. Hence, a specific action must be taken such that the joint is magnetically shielded. As a method of providing an extremely stable magnetic field without such a specific action, a method disclosed in Japanese Examined Patent Application Publication No. 4-61103 has been proposed heretofore.

In FIG. 7, a persistent-mode superconducting magnet apparatus 30 according to this method includes a first superconducting magnet 31 on the outer peripheral side, and a second superconducting magnet 32 on the inner peripheral side, which are concentric with each other, inside of which a working space is formed. On the outer peripheral side of the first superconducting magnet 31, field-correcting superconducting coils 33 are further disposed in a concentric manner with the first superconducting magnet 31 and the second superconducting magnet 32.

The first superconducting magnet 31 includes a first superconducting coil 34 which is cylindrically wound, a first persistent-current switch 35 connected in parallel to the first superconducting coil 34, an energizing (field exciting) power supply 36 for supplying an electric current to the first superconducting coil 34, and a heater power supply 37 for supplying an electric current to a heater of the first persistent-current switch 35. The second superconducting magnet 32 includes a second superconducting coil 38 having another superconducting wire concentrically and cylindrically wound on the inner periphery of the first superconducting coil 34, a second persistent-current switch 39 connected in parallel to the second superconducting coil 38, an energizing (field exciting) power supply 40 for supplying an electric current to the second superconducting coil 38, and a heater power supply 41 for supplying an electric current to a heater of the second persistent-current switch 39.

Within a cryostat 42, the first superconducting magnet 31 and the second superconducting magnet 32 are electrically independent from each other, and the second superconducting coil 38 is provided on the inside of a bore of the first superconducting coil 34. Accordingly, the magnetic field decay in the working space along with the electric current decay of the second superconducting coil 38 is compensated by an increment in the magnetic field of the working space in the first superconducting coil 34, which is caused by the electric current mutually induced by the first superconducting coil 34 along with that electric current decay, so that the magnetic field of the working space attempts to be maintained in an extremely stable manner. In other words, making a reduction in the magnetic field, which is caused by an electric current of the second superconducting coil 38, to be equal to an increment in the magnetic field induced therefrom, which is caused by an electric current of the first superconducting coil 34, may maintain a constant field strength in the working space.

Meanwhile, the aforementioned conventional approach requires the separate and independent energizing power supplies 36 and 40, as well as the heater power supplies 37 and 41 for the separate and independent persistent-current switches 35 and 39, in order to energize the two independent superconducting magnets 31 and 32, respectively. In addition, when the first superconducting coil 34 and the second superconducting coil 38, which are electrically independent from each other, are energized, there is a probability that forces acting on the coils in the magnetic field are not balanced resulting in damage to the coil windings, and thus the superconducting magnets 31 and 32 must be concurrently energized at the same proportion of energizing rate. Accordingly, since two energizing arrangements such as the energizing power supplies 36 and 40 are employed and the two arrangements are operated, the operation of the superconducting magnet apparatus 30 is complex, and because of complexity, this operation is considerably different from the operation of a persistent-mode superconducting magnet apparatus having only one superconducting magnet (the case where there is no need for concurrent energizing at the same proportion of energizing rate).

SUMMARY OF THE INVENTION

The present invention overcomes the foregoing conventional problems, and has an object to provide a persistent-mode superconducting magnet apparatus which yields an extremely stable central magnetic field in the vicinity of the magnet apparatus center without any specific technique or action on the superconducting joints and by using similar energizing equipment and operation to those of a magnet apparatus having only one superconducting magnet.

A persistent-mode superconducting magnet apparatus according to the present invention is characterized by including: a superconducting magnet having a plurality of unit superconducting coils connected in series; a first persistent-current switch connected to the ends of the series circuit formed of the unit superconducting coils connected in series; and at least one second persistent-current switch connected to the ends of any one or a predetermined number of consecutive unit superconducting coils of the plurality of unit superconducting coils. In this case, a plurality of second persistent-current switches may be disposed.

With this construction, a superconducting magnet circuit includes, besides a closed circuit formed of a plurality of unit superconducting coils connected in series and a first persistent-current switch, at least one second persistent-current switch which forms a closed circuit by connecting the ends of any one or a plurality of unit superconducting coils of the plurality of unit superconducting coils, and is thus divided into at least two closed circuits, whereby their mutual induction may suppress the magnetic field decay in the vicinity of the magnet apparatus center, thus maintaining the magnetic field in the vicinity of the magnet apparatus center in an extremely stable manner. Furthermore, each of the superconducting magnets which form at least two closed circuits has a plurality of unit superconducting coils connected in series, and can be easily energized concurrently at the same proportion of energizing rate, whereby there is no need to use two energizing arrangements such as the usual use of energizing power supplies for two electrically independent superconducting magnets, thus reducing the number of parts. Further, there is no need to operate the two arrangements, thus preventing the operation from being complex. Therefore, it can be easily energized concurrently at the same proportion of energizing rate without any specific joint technique such as spot welding or any specific action such as magnetic shielding for the joint between superconducting wires, and by using similar energizing equipment (a single energizing power supply and a single heater power supply) to that of the one having only one superconducting magnet, as well as by using similar operation to that of the one having only one superconducting magnet, thereby preventing the operation from being complex as usual, providing an extremely stable central magnetic field in the vicinity of the magnet apparatus center.

DESCRIPTION OF THE PREFERRED EMBODIMENTS

A preferable implementation of the present invention is that one second persistent-current switch is disposed, and if the self-inductance of the unit superconducting coil to which the second persistent-current switch is connected is indicated as $L_1$, the minute resistance contained in the unit superconducting coil is indicated as $R_1$, the self-inductance of the remaining unit superconducting coils is indicated as $L_2$, the minute resistance contained in the remaining unit superconducting coils is indicated as $R_2$, and the mutual inductance therebetween is indicated as $M$, the second persistent-current switch is connected to the ends of one or a predetermined number of unit superconducting coils so as to satisfy $$\left|\frac{\{K_1(L_2R_1 - MR_2) + K_2(L_1R_2 - MR_1)\}}{L_1L_2 - M^2}\right| < \left|(K_1 + K_2)\frac{(R_1 + R_2)}{L_1 + L_2 + 2M}\right| \quad (1)$$

With this construction, the second persistent-current switch is placed, to form a closed circuit, at a location so as to satisfy the above-described conditional expression (1), which allows the central magnetic field decay in the vicinity of the magnet apparatus center to be reduced lower than that of a conventional superconducting magnet having no second persistent-current switch. This enables the magnetic field decay rate to be reduced lower than that of a superconducting magnet having no second persistent-current switch, thus achieving a superconducting magnet apparatus which yields an extremely stable central magnetic field in the vicinity of the magnet apparatus center.

Preferably, the first persistent-current switch and the second persistent-current switch in the persistent-mode superconducting magnet apparatus of the present invention are both thermal persistent-current switches, whose heater is connected in series to a heater power supply. This construction allows the heaters of the first persistent-current switch and the second persistent-current switch to be connected in series, and the heater power supply can thus be shared.

First Embodiment

Figure 1:
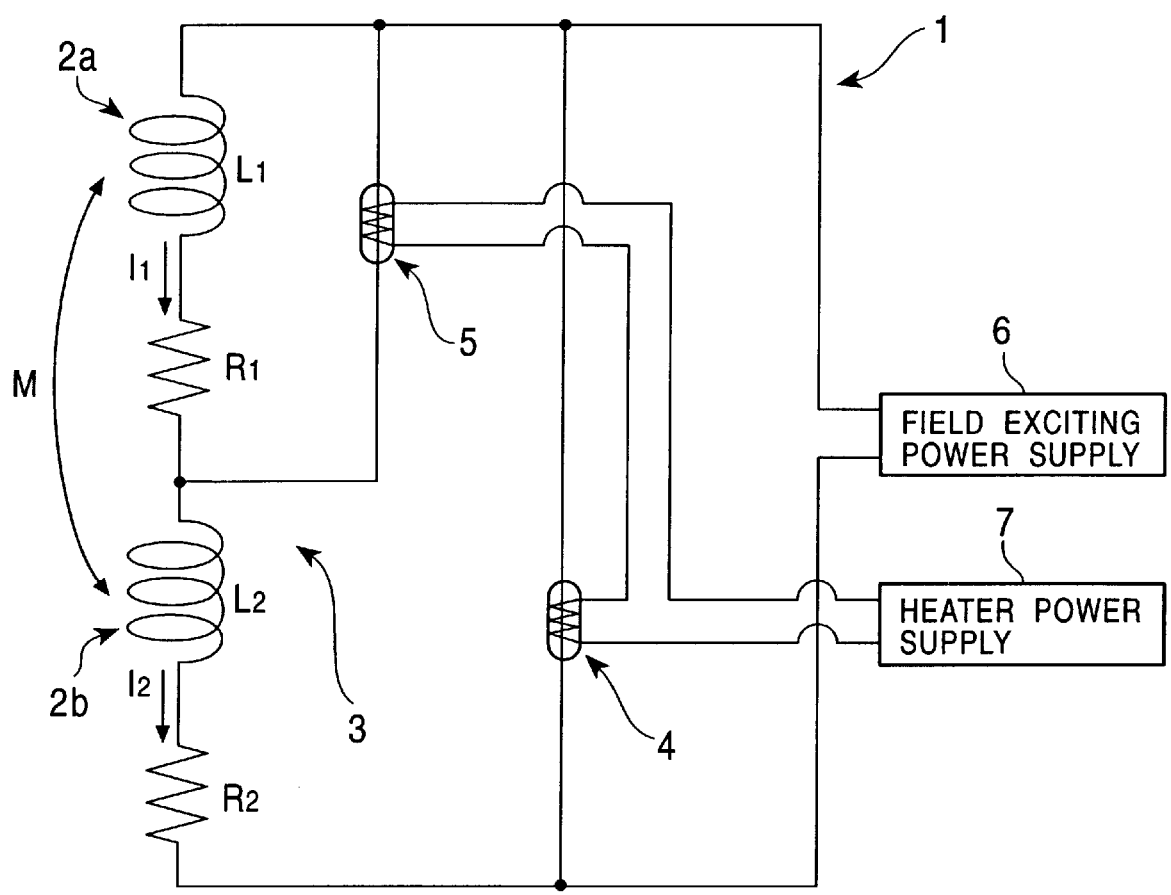
FIG. 1 is an electrical circuit diagram showing the basic concept of a superconducting magnet apparatus in accordance with a first embodiment of the present invention.

FIG. 1 is an electrical circuit diagram showing the basic concept of a superconducting magnet apparatus in accordance with a first embodiment of the present invention.

In FIG. 1, the persistent-mode superconducting magnet apparatus 1 includes a superconducting magnet 3 having concentric unit superconducting coils 2a and 2b connected in series, and an energizing (field exciting) power supply 6 capable of supplying an electric current to the series circuit of the unit superconducting coils 2a and 2b. The inside of the cylindrical unit superconducting coils 2a and 2b serves as a working space, such that an analysis sample is inserted (NMR) into the working space to perform a predetermined chemical composition analysis while a high field is being generated, or human body is inserted (MRI) into the working space for a body examination while a high field is being generated. The unit superconducting coils 2a and 2b may be each formed of one or a predetermined number of further unit superconducting coils.

The superconducting magnet apparatus 1 further includes a first persistent-current switch 4 connected to the ends of the series circuit of the unit superconducting coils 2a and 2b, a second persistent-current switch 5 connected to the ends of the unit superconducting coil 2a, and a heater power supply 7 capable of supplying an electric current to heaters of the first persistent-current switch 4 and the second persistent-current switch 5. The first persistent-current switch 4 and the second persistent-current switch 5 are both thermal persistent-current switches whose heater is connected in series so that an electric current is supplied thereto from the heater power supply 7.

In this way, besides the first persistent-current switch 4 which forms a closed circuit together with the unit superconducting coils 2a and 2b connected in series, the second persistent-current switch 5 connected to the ends of the unit superconducting coil 2a to form a closed circuit is disposed. Accordingly, a superconducting magnet circuit is formed of two closed circuits, and their mutual induction suppresses the magnetic field decay in a working space (in the vicinity of the magnet apparatus center), thus maintaining the magnetic field in the working space in an extremely stable manner.

In this regard, their mutual induction means mutual induction between the unit superconducting coil 2a connected in parallel to the second persistent-current switch 5 and the unit superconducting coil 2b other than the superconducting coil 2a. For example, as an electric current of the unit superconducting coil 2b decreases to cause the magnetic flux to decrease, an electric current corresponding to the amount of electric current change (decrease) of the unit superconducting coil 2b is induced to the unit superconducting coil 2a which crosses that magnetic flux. This may offset and suppress the magnetic field decay in the working space, thus maintaining the magnetic field in the working space in an extremely stable manner. In this regard, although the same value of electric currents flow to the unit superconducting coils 2a and 2b when the unit superconducting coils 2a and 2b are merely connected in series to the energizing power supply 6, a closed circuit formed by connecting the ends of the unit superconducting coil 2a may allow an increased electric current which corresponds to an electric current change (decrease) of the unit superconducting coil 2b to be induced to the unit superconducting coil 2a.

With reference to the above-described construction, a persistent-current operation is described. Initially, the heater of each of the first persistent-current switch 4 connected in parallel to the series circuit of the plurality of the unit superconducting coils 2a and 2b, and the second persistent-current switch 5 connected in parallel to the unit superconducting coil 2a is heated by the external heater power supply 7 so that the persistent-current switches 4 and 5 are in an open state (OFF-state). In the open state (OFF-state) of the persistent-current switches 4 and 5, an electric current is supplied to the plurality of unit superconducting coils 2a and 2b by the external energizing power supply 6 until the electric current value reaches particular predetermined electric current value $I_0$.

When a value of the supplied electric current reaches particular the predetermined electric current value $I_0$, power from the external heater power supply 7 is turned off to switch the persistent-current switches 4 and 5 to be in a closed state (ON-state) for a persistent-current operation in which an electric current circulates between the closed circuit formed of the unit superconducting coils 2a and 2b and the first persistent-current switch 4, and the closed circuit formed of the unit superconducting coil 2a and the second persistent-current switch 5.

By doing this, initially, in the initial state where the unit superconducting coils 2a and 2b are energized, electric current $I_1$, of the unit superconducting coil 2a and electric current $I_2$ of the unit superconducting coil 2b are both equal to the predetermined electric current $I_0$, although they individually encounter decay over time since the minute resistances $R_1$ and $R_2$ exist in the unit superconducting coils 2a and 2b.

Herein, if the self-inductance of the unit superconducting coil 2a which forms a closed circuit together with the second persistent-current switch 5 is indicated as $L_1$, the minute resistance which results from the joints, etc., contained in the unit superconducting coil 2a is indicated as $R_1$, the self-inductance of the unit superconducting coil 2b other than the unit superconducting coil 2a is indicated as $L_2$, the minute resistance which results from the joints, etc., contained in the unit superconducting coil 2b is indicated as $R_2$, and the mutual inductance between the unit superconducting coils 2a and 2b is indicated as M, then the electric current change due to the minute resistances $R_1$ and $R_2$ is found by circuit equations (2 and 3) as follows:

$$L_1 \frac{dI_1}{dt} + M \frac{dI_2}{dt} + R_1 I_1 = 0 \qquad (2)$$

$$M \frac{dI_1}{dt} + L_2 \frac{dI_2}{dt} + R_2 I_2 = 0 \qquad (3)$$

On the other hand, in a conventional superconducting magnet in the case where the second persistent-current switch 5 is not disposed, the electric current change after energizing is found by a circuit equation (4) as follows:

$$L_0 \frac{dI}{dt} + R_0 I = 0 \qquad (4)$$

If $t=0$, $I_1=I_2=I_0$, and the following (Expression 5) is given from the above-described (Eq. 2) and (Eq. 3):

$$\begin{cases} I_1 \approx I_0\left(1 + \frac{MR_2 - L_2 R_1}{L_1 L_2 - M^2} t\right) \\ I_2 \approx I_0\left(1 + \frac{MR_1 - L_1 R_2}{L_1 L_2 - M^2} t\right) \end{cases} \qquad (5)$$

Furthermore, from (Eq. 4), $$I = I_0 e^{-\frac{R_0}{L_0} t} \approx I_0\left(1 - \frac{R_0}{L_0} t\right) \qquad (6)$$

where $L_0$ represents the inductance of the whole circuit, and satisfies $L_0=L_1+L_2+2M$; and $R_0$ represents the minute resistance in the whole circuit, and satisfies $R_0=R_1+R_2$.

Accordingly, in order to reduce the magnetic field decay in the working space compared to that of a conventional superconducting magnet which does not include the second persistent-current switch 5, magnetic field decay due to the change of electric currents $I_1$ and $I_2$ should be lower than magnetic field decay due to the change of electric current I. That is, the following (Eq. 7) should be established if magnet constants (which are defined as the strength of magnetic field generated when 1A is supplied to the coils, whose unit is T/A) of the coils having electric currents $I_1$ and $I_2$ are indicated as $K_1$ and $K_2$, and the magnet constant of the whole superconducting magnet 3 is indicated as $K_0$, where $K_0=K_1+K_2$ is satisfied.

$$\left| K_1 \frac{dI_1}{dt} + K_2 \frac{dI_2}{dt} \right| = \left| K_0 \frac{dI}{dt} \right| \qquad (7)$$

If $I_1$, $I_2$, and I in the above-described (Ex. 5) and (Ex. 6) are substituted for those in the above-described (Eq. 7), then the following (Ex. 8) is obtained.

$$\left| \frac{\{K_1(L_2 R_1 - MR_2) + K_2(L_1 R_2 - MR_1)\}}{L_1 L_2 - M^2} \right| < \left| (K_1 + K_2) \frac{(R_1 + R_2)}{L_1 + L_2 + 2M} \right| \qquad (8)$$

By positioning the second persistent-current switch 5 at a location so as to satisfy this conditional expression (8) to form a closed circuit, the magnetic field decay rate can be lower than that of a conventional superconducting magnet which does not include the second persistent-current switch 5. Thus, the superconducting magnet apparatus 1 which yields an extremely stable central magnetic field in the working space can be attained.

Second Embodiment

In the first embodiment, the second persistent-current switch 5 is connected in parallel to the unit superconducting coil 2a, which is any one of the plurality of unit superconducting coils 2a and 2b connected in series, to form a closed circuit. In this second embodiment, on the other hand, a second persistent-current switch is connected in parallel to consecutive coils of (a plurality of) unit superconducting coils in a plurality of unit superconducting coils connected in series, to form a closed circuit.

Figure 2:
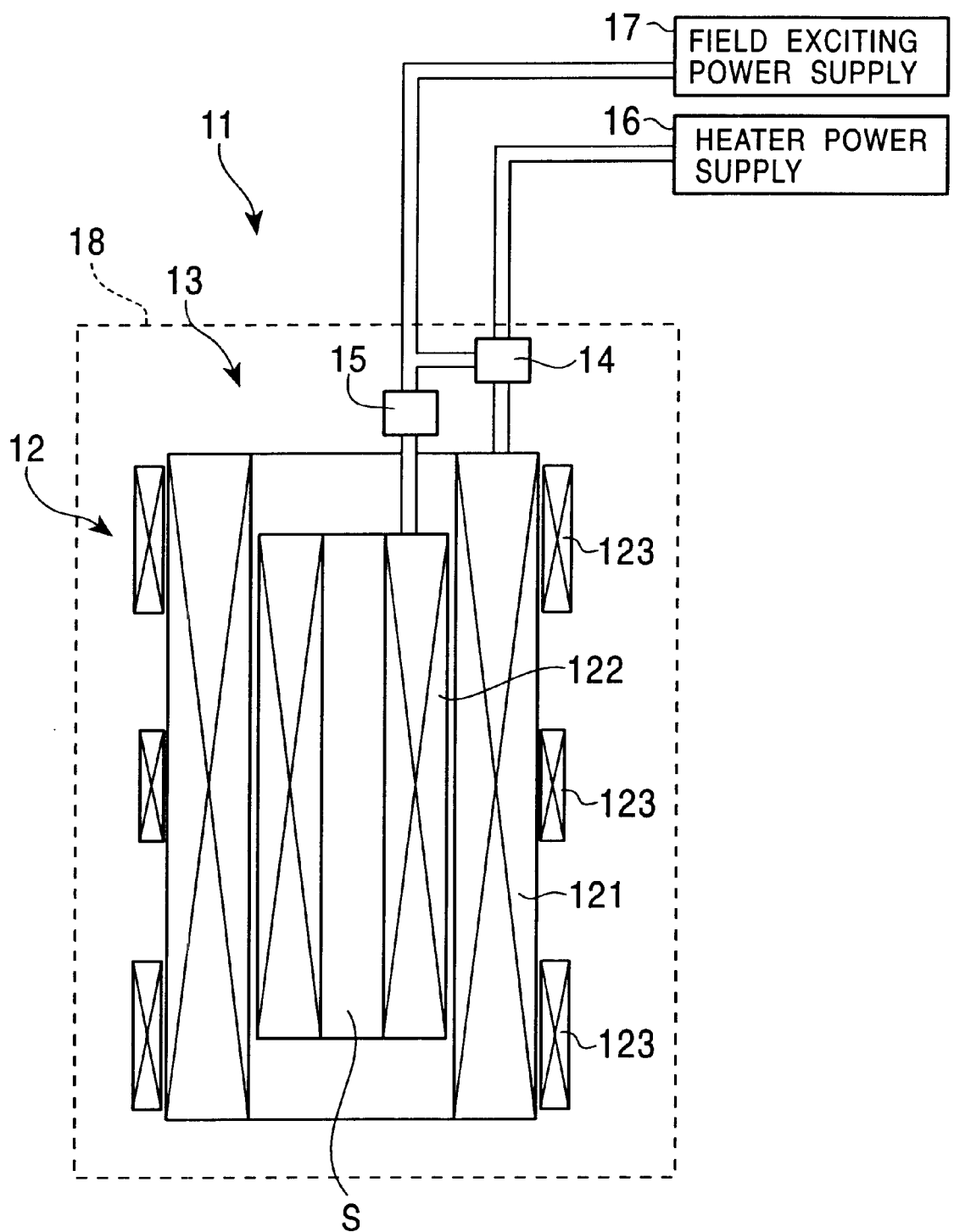
FIG. 2 is a longitudinal cross-sectional view schematically showing a superconducting magnet apparatus having field-correcting superconducting coils, in accordance with a second embodiment of the present invention.
Figure 3:
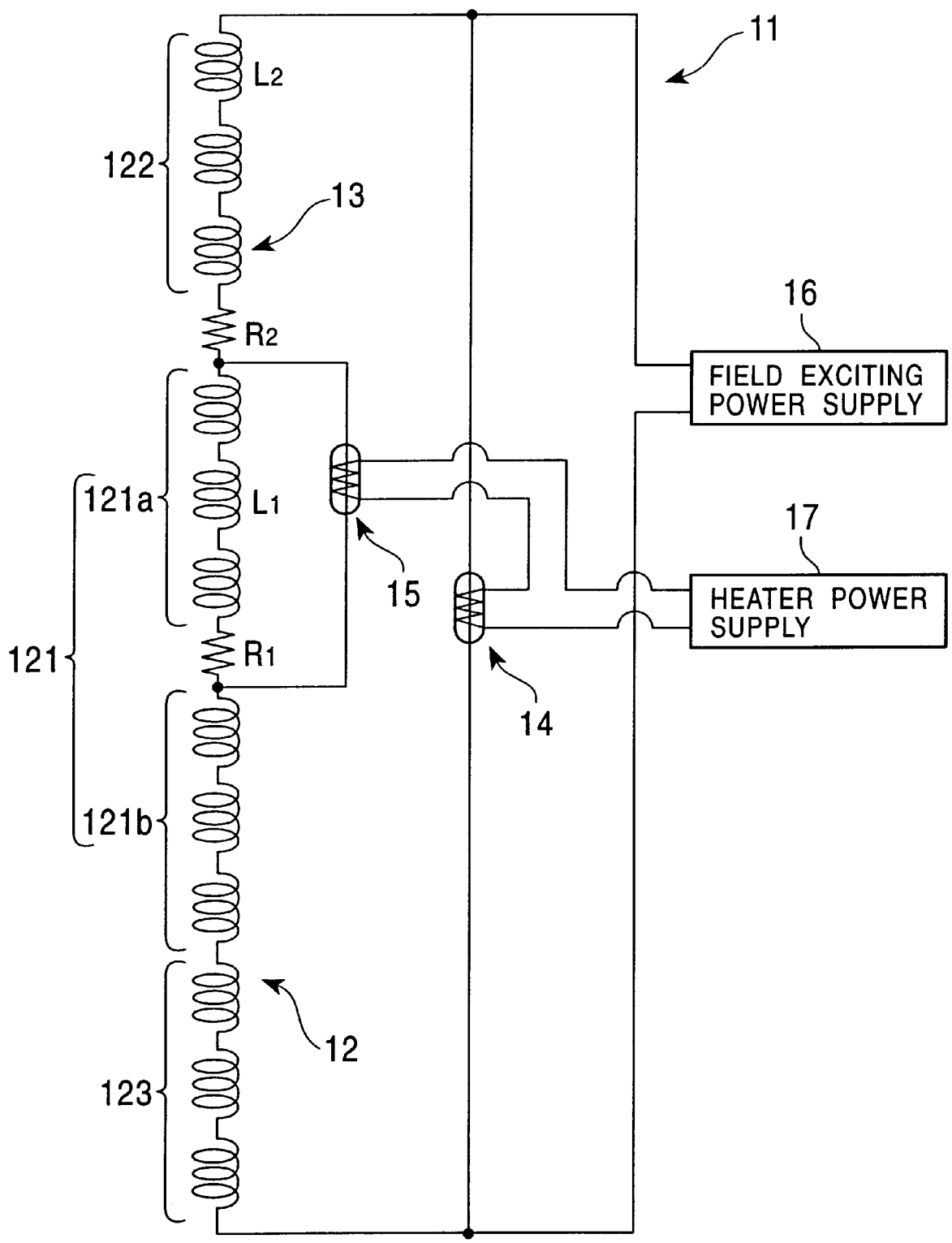
FIG. 3 is an electrical circuit diagram of the superconducting magnet apparatus shown in FIG. 2.

FIG. 2 is a longitudinal cross-sectional view schematically showing a superconducting magnet apparatus having field-correcting superconducting coils, in accordance with a second embodiment of the present invention, and FIG. 3 is an electrical circuit diagram schematically showing the superconducting magnet apparatus shown in FIG. 2.

In FIGS. 2 and 3, the persistent-mode superconducting magnet apparatus 11 includes a superconducting magnet 13 having superconducting coils 12 connected in series which have a plurality of unit superconducting coils concentrically arranged, and an energizing (field exciting) power supply 16 connected to the ends of the series circuit of the superconducting coils 12 for supplying an electric current to the series circuit of the superconducting coils 12. At the central axis portion within the cylindrical superconducting coils 12 is formed working space S by virtue of a high magnetic field.

The persistent-mode superconducting magnet apparatus 11 further includes a first persistent-current switch 14 connected in parallel to the plurality of superconducting coils 12 to form a closed circuit, and a second persistent-current switch 15 connected in parallel to arbitrary consecutive ones, e.g., superconducting coils 121a, of the plurality of superconducting coils 12 to form a closed circuit. The first persistent-current switch 14 and the second persistent-current switch 15 are both thermal persistent-current switches, and a heater of the first persistent-current switch 14 and a heater of the second persistent-current switch 15 are connected in series within a cryostat 18, the ends of the series connection of which is connected to an external heater power supply 17 so that an electric current can be supplied thereto from the heater power supply 17.

The superconducting coils 12 include superconducting coils 121, 122, and 123. The superconducting coils 121 (121a and 121b) are made up of six concentrically and radially layered unit superconducting coils having the same length in the axial direction, each being wound in a required number of turns. On the inside of this, the superconducting coils 122 are received and arranged in a manner concentric with the superconducting coils 121 with which they interact. The superconducting coils 122 are set to have a slightly shorter length in the axial direction than that of the superconducting coils 121, and are made up of three concentrically and radially layered unit superconducting coils each wound in a required number of turns. The air core of the superconducting coils 122 serves as working space S by virtue of a high magnetic field strength. Making the axial length of the superconducting coils 121 longer than that of the superconducting coils 122 enhances the magnetic field uniformity in the working space S axially as much as possible (by reducing axial harmonics errors of the magnetic field).

The field-correcting superconducting coils 123 are arranged on the outermost peripheral portion, and are arranged at locations vertically symmetric about the center of the working space S in the axial direction, i.e., at the center and the upper and lower ends in the second embodiment, each in a required number of turns (the upper and lower ones have the same number of turns). This enables the magnetic field in the working space S to be uniformly corrected axially.

Although not shown in the figures, a shielding member for inhibiting the magnetic field from leaking to the outside, for example, a shielding superconducting coil, is arranged on the outer side of the superconducting coils 123 as required.

In the above description, the working space S has a central portion into which an analysis sample (in the case of NMR) or human body (in the case of MRI) is inserted for chemical composition analysis or medical examination under a high magnetic field.

As mentioned above, a superconducting magnet circuit is formed of two closed circuits, and their mutual induction may suppress the magnetic field decay in the working space S in the vicinity of the magnet apparatus center. The mutual induction of this case is mutual induction between the unit superconducting coils 121a connected in parallel to the second persistent-current switch 15 and the superconducting coils 122, 121b and 123 other than the superconducting coils 121a. For example, as an electric current which flows to the superconducting coils 122, 121b, and 123 decreases to cause the magnetic flux to decrease, an increased electric current corresponding to the amount of the electric current change (decrease) is induced to the superconducting coils 121a which cross that magnetic flux. This may suppress the magnetic field decay in the working space S, thus maintaining the magnetic field in the working space S in an extremely stable manner. In this regard, the value of electric current which flows to the superconducting coils 12 is always the same when the superconducting coils 12 are merely connected in series. However, a closed circuit formed by connecting both ends of the superconducting coils 121a may allow an increased electric current which corresponds to the amount of electric current change (decrease) of the remaining superconducting coils 122, 121b, and 123 to be induced to the superconducting coils 121a.

As is described in greater detail hereinbelow, the superconducting coils 12 in the superconducting magnet 13 are made up of a total of 12 unit superconducting coils connected in series that consist of the superconducting coils 122 having Nb$_3$Sn superconducting conductors of $\phi$0.8 mm wound around a bobbin of inner diameter $\phi$80 mm and width 350 mm, the superconducting coils 121 having NbTi superconducting conductors of $\phi$0.7 mm and $\phi$0.6 mm wound around a bobbin of inner diameter $\phi$140 mm and width 500 mm, and the field-correcting superconducting coils 123 having NbTi superconducting conductors of $\phi$0.6 mm wound. The second persistent-current switch 15 is connected in parallel to the superconducting coils 121a having three consecutive unit superconducting coils, which are parts of the superconducting coils 121 having NbTi superconducting wires wound.

In this case, the self-inductance $L_0$ of the whole superconducting coils 12 is 120 H, the self-inductance $L_1$ of the respective unit superconducting coils 121a divided by the second persistent-current switch 15 is 15 H, the self-inductance $L_2$ of the remaining unit superconducting coils 122, 121b, and 123 is 55 H, and the mutual inductance M is 25 H.

On the other hand, the minute resistances of the unit superconducting coils are dominated by the resistance of joints therein, and the minute resistance in each of the unit superconducting coils is proportional to the number of joints therein. Every unit superconducting coil is connected because thicker conductors are used for the inner coils and materials used therefor are different to more efficiently generate a magnetic field, and because a long conductor across the overall coils cannot be manufactured.

Accordingly, since the minute resistance in each of the unit superconducting coils is proportional to the number of joints therein, if the minute resistance contained in the superconducting coils 121a made up of the plurality of (in the second embodiment, three) unit superconducting coils is indicated as $R_1$, and the minute resistance contained in the superconducting coils 122, 121b and 123 made up of the remaining unit superconducting coils (in the second embodiment, nine coils) is indicated as $R_2$, then $R_1$=0.25 $R_0$ and $R_2$=0.75 $R_0$ are obtained, where $R_0$ represents the minute resistance in the overall superconducting coil.

Furthermore, in the second embodiment, the magnet constants $K_1$ and $K_2$ are 0.044 T/A and 0.086 T/A, respectively. Therefore, the left and right sides of the above-described (Ex. 8) are respectively given by $$\left| \frac{\{K_1(L_2R_1 - MR_2) + K_2(L_1R_2 - MR_1)\}}{L_1L_2 - M^2} \right| = 0.00105R_0$$

$$\left| (K_1 + K_2)\frac{(R_1 + R_2)}{L_1 + L_2 + 2M} \right| = 0.00108R_0$$

The second persistent-current switch 15 is thus connected to both ends of the superconducting coils 121a made up of one or a predetermined number of (in the second embodiment, consecutive three) unit superconducting coils so as to satisfy the above-described conditional expression (8).

With the above-described construction, initially, upon power from the external heater power supply 17, the first persistent-current switch 14 connected in parallel to the overall superconducting coils 12 made up of 12 unit superconducting coils connected in series, and the second persistent-current switch 15 connected in parallel to the superconducting coils 121a made up of three unit superconducting coils, which are parts of the NbTi superconducting coils 121, are turned to be in an open state, while the external energizing power supply 16 is used to pass an electric current to the superconducting coil 12 to energize.

Then, when the electric current value of the superconducting magnet 13 reaches the particular predetermined electric current value $I_0$, the external heater power supply 17 is turned off, and the first persistent-current switch 14 and the second persistent-current switch 15 are both turned to be in a closed state, to form closed circuits, respectively.

Figure 4:
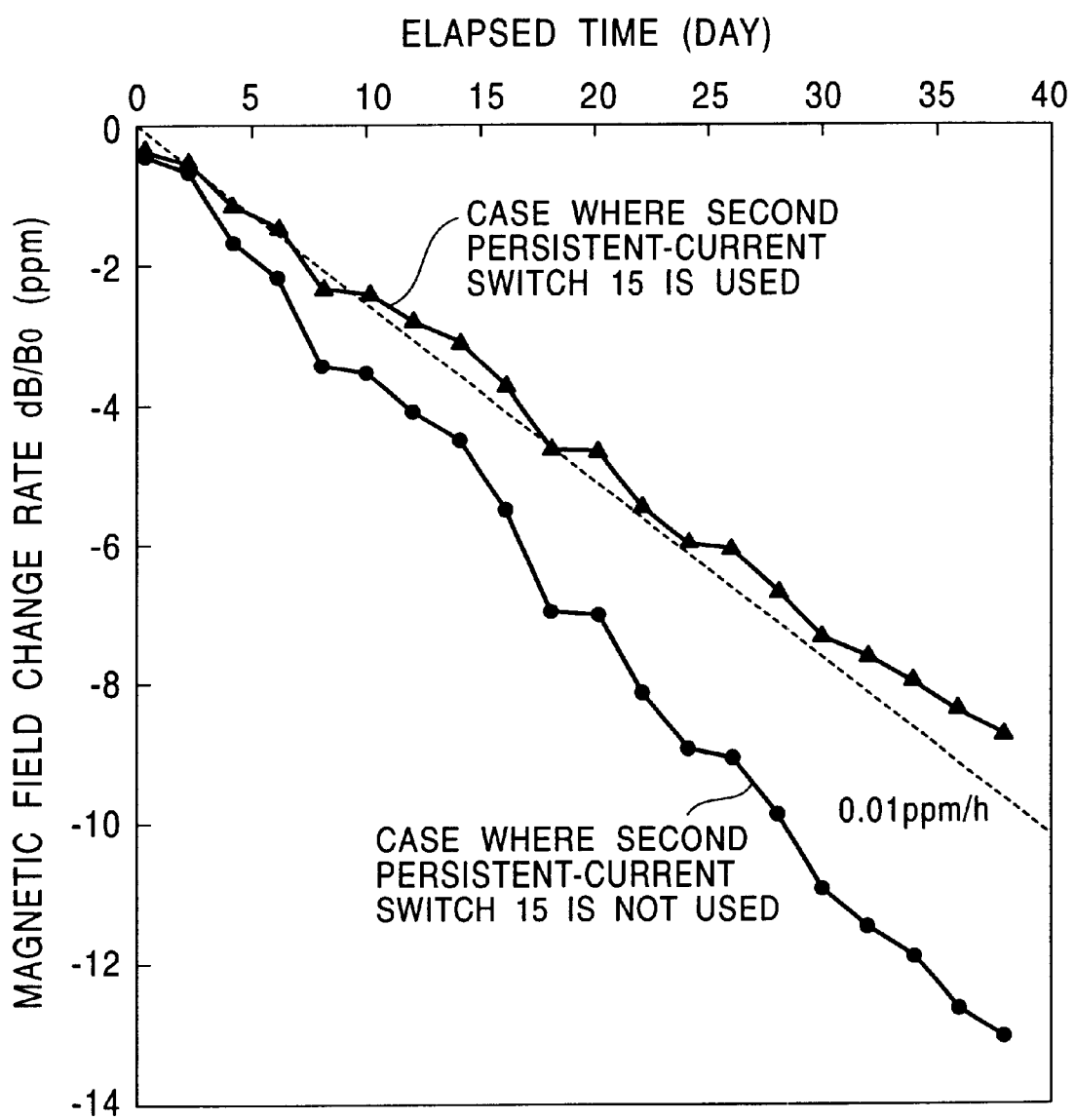
FIG. 4 is a view which depicts the measurement result of the decay rate of the magnet apparatus' central magnetic field using the superconducting magnet apparatus shown in FIG. 2.

The result of measurement on the magnet apparatus central magnetic field over a long period of one month or more since then is depicted in FIG. 4. For comparison, the result of the same measurement without the use of the second persistent-current switch 15 is also depicted in FIG. 4. As apparent from the measurement results depicted in FIG. 4, the use of the second persistent-current switch 15 enables a superconducting magnet circuit to be divided into two closed circuits, and their mutual induction may reduce the magnetic field decay rate to be lower than the conventional superconducting magnet apparatus, thus providing an extremely stable magnetic field having a magnetic field decay rate of approximately 0.01 ppm/hr.

Accordingly, the persistent-mode superconducting magnet apparatus 1 or 11 of the present invention includes, besides a closed circuit formed of a plurality of unit superconducting coils connected in series and the first persistent-current switch 4 or 14, the second persistent-current switch 5 or 15 which forms a closed circuit by connecting the ends of any one or a plurality of unit superconducting coils of the plurality of unit superconducting coils. Therefore, the superconducting magnet circuit is made up of two closed circuits, and their mutual induction may suppress the magnetic field decay in the vicinity of the magnet apparatus center, thus providing an extremely stable magnetic field in the vicinity of the magnet apparatus center. Each of the superconducting magnets which form the two closed circuits has a plurality of unit superconducting coils connected in series, and can be easily energized concurrently at the same proportion of energizing rate, thus eliminating complexity, unlike a conventional operation in which two energizing arrangements having two electrically independent superconducting magnets are used for concurrent energizing at the same proportion of energizing rate. Therefore, it can be easily energized concurrently at the same proportion of energizing rate without any specific joint technique such as spot welding or any specific action such as magnetic shielding for a joint between superconducting wires, and by using similar energizing equipment (a single energizing power supply 6 or 16, and a single heater power supply 7 or 17) to that of the one having only one superconducting magnet, as well as by using similar operation to that of the one having only one superconducting magnet, thereby preventing the usual operation from being complex, providing an extremely stable central magnetic field in the vicinity of the magnet apparatus center.

Since the second persistent-current switch 5 or 15 is placed at a coil location so as to satisfy the above-described conditional expression (1) to form a closed circuit, the magnetic field decay rate can be lower than a conventional superconducting magnet which does not include the second persistent-current switch 5 or 15, thus achieving a superconducting magnet apparatus which yields an extremely stable central magnetic field in the vicinity of the magnet apparatus center.

Furthermore, since the heaters of the first persistent-current switch 4 or 14 and the second persistent-current switch 5 or 15 are connected in series, the heater power supply 7 or 17 can be shared, thereby reducing the number of parts. In addition, the same operation can be used to energize as that of the one having only one superconducting magnet.

Although in the above-described second embodiment, a closed circuit by the second persistent-current switch 15 contains the superconducting coils 121a made up of three consecutive unit superconducting coils connected in series, it is not restrictive, and may contain any one or a plurality of unit superconducting coils of the superconducting coils 122, 121b, and 123. Otherwise, a plurality of consecutive unit superconducting coils across any of the superconducting coils 122, 121a, 121b, and 123 may be contained.

For example, as the second persistent-current switch 15 which forms a closed circuit changes its location, the self-inductance of the superconducting coils connected in parallel to the second persistent-current switch 15 also changes, and the minute resistance resulting from joints, etc., contained in those superconducting coils also changes. Thus, the self-inductance of all the superconducting coils except for those superconducting coils also changes, the minute resistance resulting from joints, etc., contained in those superconducting coils also changes, and the mutual inductance M therebetween also changes. In summary, as long as the location of the second persistent-current switch 15 is disposed at a location so as to satisfy the above-conditional expression (1), the magnetic field decay rate can be lower than a conventional superconducting magnet which does not include the second persistent-current switch 15, thus achieving a superconducting magnet apparatus which yields an extremely stable central magnetic field in the vicinity of the magnet apparatus center.

Third Embodiment

Although in the above-described first and second embodiments, two closed circuits consisting of a closed circuit formed of the first persistent-current switch 4 or 14, and a closed circuit formed of the second persistent-current switch 5 or 15 are used, and their mutual induction allows the central magnetic field in the vicinity of the magnet apparatus center to be extremely stable, it is not restrictive, and a plurality of second persistent-current switches may be used to form multiple stages of closed circuits, whose coils generate mutual induction to yield an extremely stable central magnetic field in the vicinity of the magnet apparatus center. In this case, desirably, persistent-current switches are arranged according to the number of closed circuits. However, since an electric current which flows to their heaters increases, a large capacity of heater power supply is required and operation to connect the persistent-current switches to coils is further required, so that it is appropriate to dispose a desirable number of closed circuits in light of these points.

Figure 5:
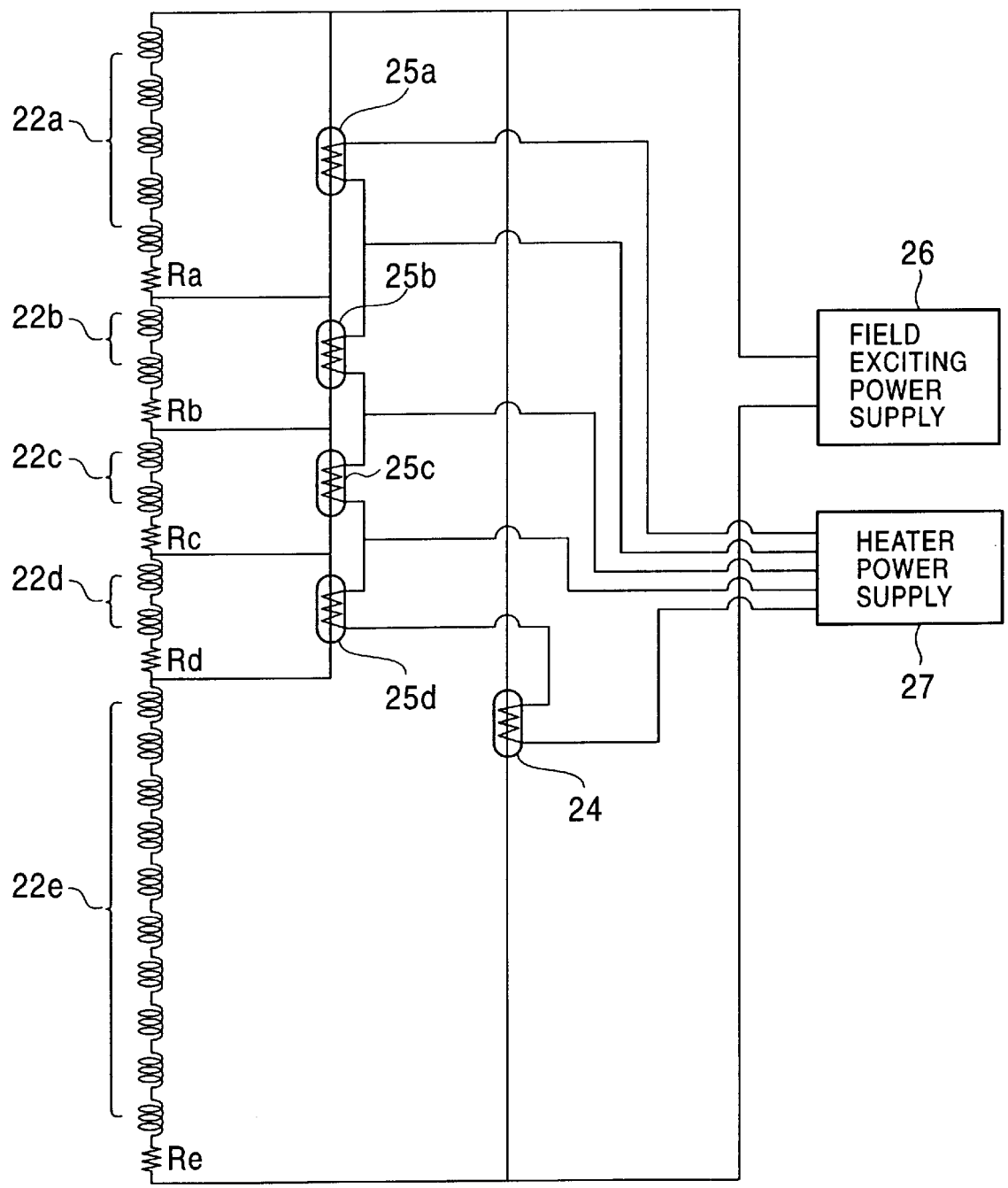
FIG. 5 is a longitudinal cross-sectional view schematically showing a superconducting magnet apparatus in accordance with a third embodiment of the present invention.

FIG. 5 is an electrical circuit diagram of a persistent-mode superconducting magnet according to the present invention. The persistent-mode superconducting magnet has a total of 21 unit superconducting coils connected in series, which have NbTi superconducting wires and Nb$_3$Sn superconducting wires wound, and includes a first persistent-current switch 24 connected in parallel to these, which is then connected to an external energizing (field exciting) power supply 26. Second persistent-current switches 25a, 25b, 25c, and 25d are further connected in parallel to a plurality of consecutive unit superconducting coils 22a, 22b, 22c, and 22d. The self-inductances La, Lb, Lc, Ld, and Le of the plurality of unit superconducting coils 22a, 22b, 22c, 22d, and 22e, and the mutual inductances therebetween Mab, Mac, Mad, Mae, Mbc, Mbd, Mbe, Mcd, Mce, and Mde, and the magnet constants Ka, Kb, Kc, Kd, and Ke are as follows: La=1.929 H, Lb=1.925 H, Lc=2.075 H, Ld=1.962 H, and Le=139.153 H; Mab=1.418 H, Mac=1.211 H, Mad=1.016 H, Mae=5.541 H, Mbc=1.766 H, Mbd=1.478 H, Mbe=8.269 H, Mcd=1.835 H, Mce=10.239 H, and Mde=11.390 H; and Ka=0.0169 T/A, Kb=0.0092 T/A, Kc=0.0080 T/A, Kd=0.0067 T/A, and Ke=0.0343 T/A.

A description is made on the magnetic field decay rate of the magnet apparatus center in the above-described configuration. Initially, heaters of the first persistent-current switch 24 and the second persistent-current switches 25a, 25b, 25c, and 25d are heated by an external heater power supply 27 so that they are individually in an open state (OFF-state). Then, power from the external energizing power supply continues until an electric current which flows to the superconducting coils 22a, 22b, 22c, 22d, and 22e reaches predetermined electric current value $I_0$. When the electric current which flows the superconducting coils reaches the predetermined electric current value $I_0$, then the heater current of the first persistent-current switch 24 is turned off to be in a closed state (ON-state), so that the overall superconducting magnets is in a persistent-current mode. When the magnetic field decay rate of the magnet apparatus center is measured under this state, the field decay rate was −0.03 ppm/hr exceeding the specified 0.01 ppm/hr. Therefore, the self-inductance L of the overall superconducting coils is 235.370 H, and hence the minute resistance in the superconducting coils is expressed by $1.96 \times 10^{-9} \Omega$.

Next, when the magnetic field decay rate of the magnet apparatus center is measured while any one of the second persistent-current switches 25a, 25b, 25c, and 25d is in a closed state (ON-state), the following result was obtained.

When the second persistent-current switch 25a is in a closed state (ON-state): +0.012 ppm/hr When the second persistent-current switch 25b is in a closed state (ON-state): −0.375 ppm/hr When the second persistent-current switch 25c is in a closed state (ON-state): −0.012 ppm/hr When the second persistent-current switch 25d is in a closed state (ON-state): −0.019 ppm/hr When the second persistent-current switches 25a, 25c, and 25d are in a closed state (ON-state), the magnetic field decay rate was reduced to be lower than the case where the second persistent-current switch is not employed. As a further improvement, by turning a plurality of the second persistent-current switches to be in a closed state (ON-state), the magnetic field decay rate can be the specified 0.01 ppm/hr or lower, and this process is described hereinbelow.

The central magnetic field decay rate in a superconducting magnet apparatus having a single second persistent-current switch, as shown in FIG. 2, is expressed from (Ex. 5) by $$\frac{1}{(K_1+K_2)I_0}\left(K_1\frac{dI_1}{dt}+K_2\frac{dI_2}{dt}\right)= \qquad (9)$$

$$-\frac{K_1(L_2R_1-MR_2)+K_2(L_1R_2-MR_1)}{(K_1+K_2)(L_1L_2-M^2)}$$

Therefore, it was found that the minute resistances Ra, Rb, Rc, Rd, and Re contained in the plurality of unit superconducting coils 22a, 22b, 22c, 22d, and 22e are as follows: Ra=$4.77 \times 10^{-13} \Omega$, Rb=$1.72 \times 10^{-9} \Omega$, Rc=$2.00 \times 10^{-11} \Omega$, Rd=$1.01 \times 10^{-11} \Omega$, and Re=$2.12 \times 10^{-10} \Omega$.

Generally, in a superconducting magnet apparatus having n second persistent-current switches, an electric current which flows in unit superconducting coils connected in parallel to each of the second persistent-current switches is expressed by $$L\frac{dI}{dt}+R'I=0 \qquad (10)$$

where L, I, and R denote the inductance matrix, the electric current matrix, and the minute resistance matrix of each of the unit superconducting coils, and are expressed by equations as follows.

$$L=\begin{pmatrix} L_1 & M_{12} & \cdots & M_{1n} \\ M_{21} & L_2 & \cdots & M_{2n} \\ \vdots & \vdots & \ddots & \vdots \\ M_{n1} & M_{n2} & \cdots & M_{nn} \end{pmatrix} I=\begin{pmatrix} I_1 \\ I_2 \\ \vdots \\ I_n \end{pmatrix} R=\begin{pmatrix} R_1 \\ R_2 \\ \vdots \\ R_n \end{pmatrix} \qquad (11)$$

Therefore, when the minute resistance R contained in each unit superconducting coil is sufficiently low, and the electric current change in each unit superconducting coil is sufficiently low compared with the driving current, it is deemed that $I_1=I_2=\ldots=I_0$, and the electric current change in each unit superconducting coil is expressed by an equation as follows.

$$\frac{dI}{dt} = -L^{-1}R^t I \quad (12)$$

On the other hand, if the magnet constants of the respective unit superconducting coils are indicated as $K_1, K_2, \ldots K_n$, and the magnet constant of the entire superconducting magnet is indicated as $K_0$, then, the magnetic field decay rate of the superconducting magnet apparatus center is expressed by $$\frac{1}{K_0 I_0} \sum_{i=1}^{n} K_i \frac{dI_i}{dt} \quad (13)$$

Thus, the magnetic field decay rate of the apparatus center can be found if the minute resistance in each unit superconducting coil is known.

Figure 6:
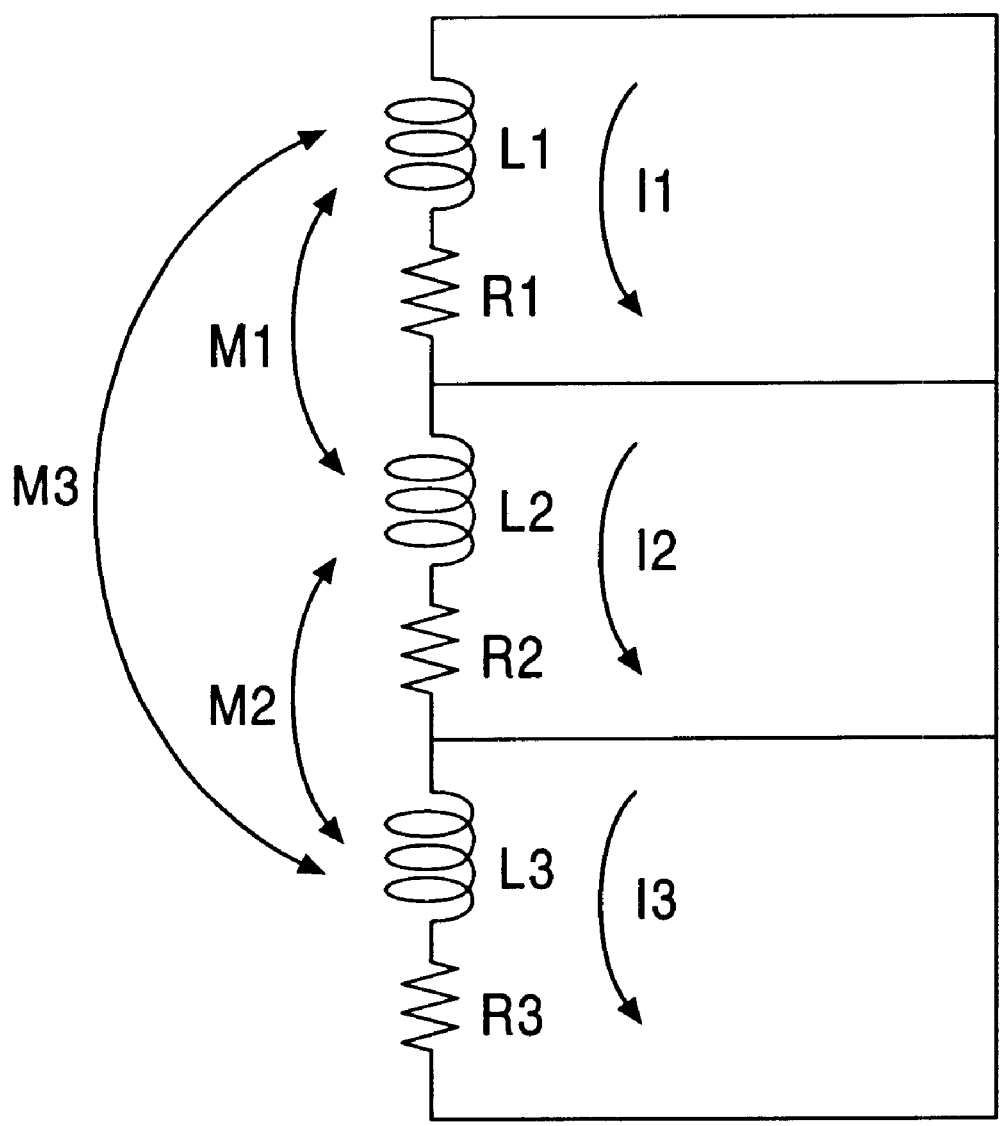
FIG. 6 is an equivalent circuit diagram of the superconducting magnet apparatus shown in FIG. 5.
Figure 7:
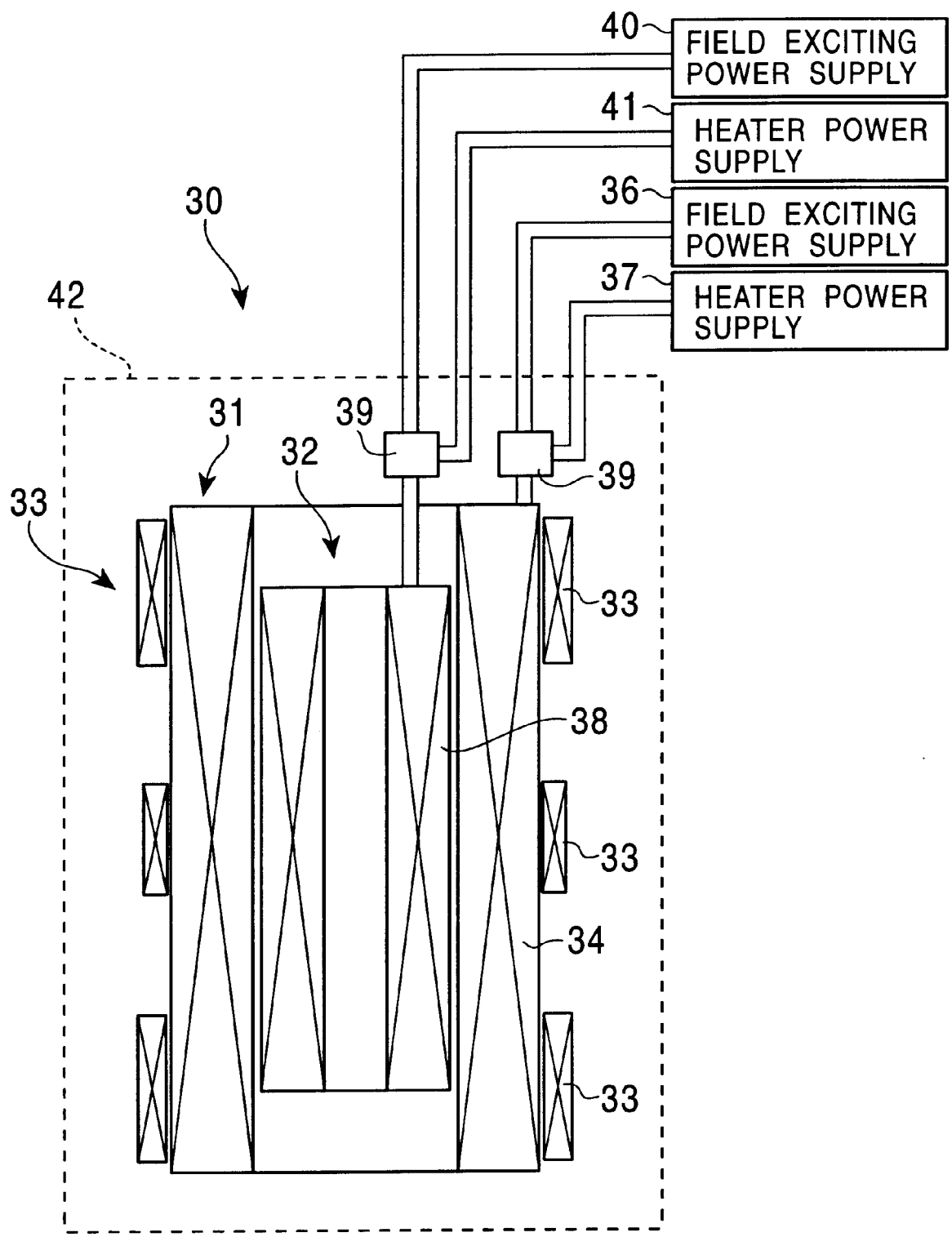
FIG. 7 is a longitudinal cross-sectional view schematically showing a conventional superconducting magnet apparatus having field-correcting superconducting coils.

Accordingly, the inductance, the magnetic constant, and the minute resistance of each unit superconducting coil in the persistent-mode superconducting magnet shown in FIG. 5 were used to calculate the magnetic field decay rate of the superconducting magnet apparatus center while the second persistent-current switches 25b, 25c, and 25d are in an open (OFF) state and in an closed (ON) state. A specific process is described with reference to the case where only the second persistent-current switches 25a and 25b are in a closed state (ON-state). When only the second persistent-current switches 25a and 25b are in a closed state (ON-state), the electrical circuit diagram shown in FIG. 5 is equivalent to an electrical circuit diagram shown in FIG. 6. The inductances, the magnet constants, and the resistances in FIG. 6 are L1=La, L2=Lb, and L3=Lc+Ld+Le+2Mcd+2Mde+2Mce; M1=Mab, M2=Mbc+Mbd+Mbe, and M3=Mac+Mad+Mae; and K1=Ka, K2=Kb, K3=Kc+Kd+Ke, R1=Ra, R2=Rb, and R3=RC+Rd+Re, so that L1=1.929 H, L2=1.925 H, and L3=190.118 H; M1=1.418 H, M2=11.513 H, and M3=7.768 H; K1=0.0169 T/A, K2=0.0092 T/A, and K3=0.0490 T/A; and R1=4.77×10$^{-13}$Ω, R2=1.72×10$^{-9}$Ω, and R3=2.42×10$^{-10}$Ω. Therefore, the change of electric current which flows in each of the closed circuits shown in FIG. 6 is found from Eq. 12 by $$\frac{dI_1}{dt} = 1.51 \times 10^{-9} \text{ A/sec,}$$

$$\frac{dI_2}{dt} = -2.55 \times 10^{-9} \text{ A/sec,}$$

$$\frac{dI_3}{dt} = -9.17 \times 10^{-12} \text{ A/sec}$$

The magnetic field decay rate of the apparatus center is thus found by 8.6167×10$^{-11}$ sec$^{-1}$=0.3102 ppm/hr from Ex. 13.

The result of calculation on the magnetic field decay rate of the superconducting magnet apparatus center using the above-described process while the second persistent-current switches 25a, 25b, 25c, and 25d shown in FIG. 5 are in an open (OFF) state and in a closed (ON) state is indicated in Table 1. It was found from Table 1 that some conditions where the magnetic field decay rate is equal to or less than the specified 0.01 ppm/hr are present.

TABLE 1

| Second Persistent-Current Switch | | | | Magnetic Field |
|---|---|---|---|---|
| 25a | 25b | 25c | 25d | Decay Rate |
| closed (ON) | closed (ON) | open (OFF) | open (OFF) | 0.3102 ppm/hr |
| closed (ON) | open (OFF) | closed (ON) | open (OFF) | 0.0037 ppm/hr |
| closed (ON) | open (OFF) | open (OFF) | closed (ON) | 0.0055 ppm/hr |
| open (OFF) | closed (ON) | closed (ON) | open (OFF) | 0.0540 ppm/hr |
| open (OFF) | closed (ON) | open (OFF) | closed (ON) | −0.4155 ppm/hr |
| open (OFF) | open (OFF) | closed (ON) | closed (ON) | −0.0182 ppm/hr |
| closed (ON) | closed (ON) | closed (ON) | open (OFF) | 0.4105 ppm/hr |
| closed (ON) | closed (ON) | open (OFF) | closed (ON) | 0.3393 ppm/hr |
| closed (ON) | open (OFF) | closed (ON) | closed (ON) | 0.0061 ppm/hr |
| open (OFF) | closed (ON) | closed (ON) | closed (ON) | −0.4625 ppm/hr |
| closed (ON) | closed (ON) | closed (ON) | closed (ON) | 0.4155 ppm/hr |

In effect, when the magnetic field decay rate of the superconducting apparatus center was measured while the second persistent-current switches 25a, 25b, 25c, and 25d were in a closed state (ON-state), an open state (OFF-state), a closed state (ON-state), and an open state (OFF-state), respectively, it was 0.0038 ppm/hr, thus providing an extremely stable magnetic field lower than the specified 0.01 ppm/hr. Furthermore, when the magnetic field decay rate of the superconducting apparatus center was measured while the second persistent-current switches 25a, 25b, 25c, and 25d were in a closed state (ON-state), an open state (OFF-state), a closed state (ON-state), and a closed state (ON-state), respectively, an extremely stable magnetic field of 0.0063 ppm/hr was obtained.

As mentioned above, according to a persistent-mode superconducting magnet of the present invention, an arbitrary number of second persistent-current switches is placed at appropriate locations, thereby suppressing the magnetic field decay in the vicinity of the magnet apparatus center, making it possible to provide an extremely stable magnetic field.

What is claimed is:

1. A persistent-mode superconducting apparatus comprising:
    a superconducting magnet having a plurality of unit superconducting coils connected in series; and
    a plurality of persistent-current switches,
    wherein two or more closed circuits including the unit superconducting coils and the persistent-current switches are present, each closed circuit being formed by connecting the persistent-current switch to both ends of any one or a predetermined number of consecutive unit superconducting coils of said plurality of unit superconducting coils.

2. A persistent-mode superconducting, apparatus comprising:
    a superconducting magnet having a plurality of unit superconducting coils connected in series; and
    a plurality of persistent-current switches,
    wherein said persistent-mode superconducting magnet apparatus includes a first persistent-current switch connected to the ends of said plurality of unit superconducting coils connected in series, and at least one second persistent-current switch connected to both ends of any one or a predetermined number of consecutive unit superconducting coils of said plurality of unit superconducting oils, and two or more closed circuits including the unit superconducting and the persistent-current switches are present.

3. A persistent-mode superconducting magnet apparatus according to claim 2, wherein one of the second persistent current switches is provided, and if the self-inductance of the unit superconducting coil connected to the second persistent-current switch is indicated as L1, the minute resistance contained in the unit superconducting coil is indicated as R2, and the mutual inductance therebetween is indicated as M, then the second persistent-current switch is connected to both ends of one or a predetermined number of unit superconducting coils so as to satisfy $$\left| \frac{\{K_1(L_2R_1 - MR_2) + K_2(L_1R_2 - MR_1)\}}{L_1L_2 - M^2} \right| < \left| (K_1 + K_2)\frac{(R_1 + R_2)}{L_1 + L_2 + 2M} \right|.$$

4. A persistent-mode superconducting magnet apparatus according to claim 1, wherein said plurality of persistent current switches are thermal persistent-current switches, whose heater is connected in series to a heater power supply.

5. A persistent-mode superconducting magnet apparatus according to claim 2, wherein said first persistent-current switch and the second persistent-current switches are both thermal persistent-current switches, whose heater is connected in series to a heater power supply.

6. A persistent-mode superconducting magnet apparatus according to claim 1, wherein said plurality of unit superconducting coils is energized from a power supply.

7. A persistent-mode superconducting magnet apparatus according to claim 1, wherein said heaters in said plurality of persistent current switches is connected in series with said heater power supply.

8. A persistent-mode superconducting magnet apparatus according to claim 1, wherein said plurality of unit superconducting coils is arranged concentrically.

9. A persistent-mode superconducting magnet apparatus according to claim 2, wherein said plurality of unit superconducting coils is energized from a power supply.

10. A persistent-mode superconducting magnet apparatus according to claim 2, wherein said heaters in said plurality of persistent current switches is connected to series with said heater power supply.

11. A persistent-mode superconducting magnet apparatus according to claim 2, wherein said plurality of unit superconducting coils is arranged concentrically.

* * * * *